United States Patent
Afzali-Ardakani et al.

(10) Patent No.: US 11,176,995 B2
(45) Date of Patent: Nov. 16, 2021

(54) CROSS-POINT ARRAY OF POLYMER JUNCTIONS WITH INDIVIDUALLY-PROGRAMMED CONDUCTANCES

(71) Applicant: International Business Machines Corporation, Armonk, NY (US)

(72) Inventors: Ali Afzali-Ardakani, Ossining, NY (US); James B. Hannon, Lake Lincolndale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/515,486

(22) Filed: Jul. 18, 2019

(65) Prior Publication Data

US 2021/0020241 A1    Jan. 21, 2021

(51) Int. Cl.
| | |
|---|---|
| *G11C 11/00* | (2006.01) |
| *G11C 13/00* | (2006.01) |
| *H01L 51/05* | (2006.01) |
| *H01L 51/00* | (2006.01) |
| *H01L 27/28* | (2006.01) |

(52) U.S. Cl.
CPC ........ *G11C 13/0069* (2013.01); *G11C 13/004* (2013.01); *G11C 13/0016* (2013.01); *H01L 27/285* (2013.01); *H01L 51/0015* (2013.01); *H01L 51/0591* (2013.01); *H01L 51/005* (2013.01); *H01L 51/0035* (2013.01)

(58) Field of Classification Search
CPC .................................................... H01L 27/285
See application file for complete search history.

(56) References Cited

U.S. PATENT DOCUMENTS

| | | |
|---|---|---|
| 7,348,653 B2 | 3/2008 | Cho et al. |
| 7,557,372 B2 | 7/2009 | Yang et al. |
| 8,385,101 B2 | 2/2013 | Yang et al. |
| 8,415,652 B2 | 4/2013 | Yang et al. |
| 8,436,340 B2 | 5/2013 | Napolitano et al. |

(Continued)

FOREIGN PATENT DOCUMENTS

JP            2016121280      *  7/2016  ............. C08G 61/12

OTHER PUBLICATIONS

Hatchett et al., "Acid Doping of Polyaniline: Spectroscopic and Electrochemical Studies," J. Phys. Chem. B Nov. 1999, 103, pp. 10992-10998.

Yongfang Li (Ed), Organic Optoelectronic Materials, Chapter 2, Conducting Polymers, 2.6.2 Electrochemical Properties of Conducting Polyaniline, Springer International Publishing, pp. 23, 39 (2015).

(Continued)

*Primary Examiner* — Uyen Smet
(74) *Attorney, Agent, or Firm* — Anthony Curro; Michael J. Chang, LLC

(57) ABSTRACT

Programmable memory devices having a cross-point array of polymer junctions with individually-programmed conductances are provided. In one aspect, a method of forming a memory device includes: forming first metal lines on an insulating substrate; forming polymeric resistance elements on the first metal lines; and forming second metal lines over the polymeric resistance elements with a single one of the polymeric resistance elements present at each intersection of the first/second metal lines forming a cross-point array. A memory device and a method of operating a memory device are also provided.

16 Claims, 8 Drawing Sheets

(56) References Cited

U.S. PATENT DOCUMENTS

| | | | |
|---|---|---|---|
| 2004/0238864 A1* | 12/2004 | Tripsas | G11C 13/0014 |
| | | | 257/296 |
| 2006/0071256 A1* | 4/2006 | Rockford | B82Y 10/00 |
| | | | 257/295 |
| 2009/0155571 A1* | 6/2009 | Mustonen | B41M 5/165 |
| | | | 428/327 |
| 2010/0200978 A1* | 8/2010 | Mengel | H01L 24/24 |
| | | | 257/690 |
| 2011/0012097 A1* | 1/2011 | Yoneya | H01L 51/10 |
| | | | 257/40 |
| 2011/0156012 A1 | 6/2011 | Wirtz et al. | |
| 2013/0001776 A1* | 1/2013 | Yu | H01L 24/19 |
| | | | 257/738 |
| 2017/0271150 A1* | 9/2017 | Chang | G03F 7/162 |

OTHER PUBLICATIONS

Jianyong Ouyang et al., "Programmable polymer thin film and non-volatile memory device," Nature Materials, vol. 3, No. 12, Dec. 2004, pp. 918-922.

Show-An Chen et al., "Polyacrylic acid-doped polyaniline as p-type semiconductor in Schottky barrier electronic device," Synthetic Metals, vol. 57, No. 1, Apr. 1993, pp. 4082-4086, Abstract (2 pages).

V. Erokhin et al., "Organic memristor devices for logic elements with memory," Int. J. Bifurcation Chaos, vol. 22, No. 11, Dec. 2012, 1250283 (9 pages).

T. Gokmen et al., "Acceleration of Deep Neural Network Training with Resistive Cross-Point Devices: Design Considerations," Frontiers in Neuroscience, vol. 10, Article 333, Jul. 2016 (13 pages).

* cited by examiner

CROSS-POINT ARRAY OF POLYMER JUNCTIONS WITH INDIVIDUALLY-PROGRAMMED CONDUCTANCES

FIELD OF THE INVENTION

The present invention relates to programmable memory devices, and more particularly, to programmable memory devices having a cross-point array of polymer junctions with individually-programmed conductances.

BACKGROUND OF THE INVENTION

A memory resistor or memristor is a non-volatile memory element that stores data based on the memristor's electrical resistance. For instance, a memristor can include an active material(s) between two electrodes. Data is written to the memristor by changing the resistance of the active material(s), thereby programming the device. Memristor devices can be arranged as an array of elements, each of which can be individually programmed or read.

Conventional memristor designs, however, employ arrangements of multiple active materials, which adds to manufacturing complexity and costs. Further, their fabrication requires a variety of different steps to define the individual memristor elements, which is time consuming, costly, and can reduce yield.

Thus, improved memory device designs and techniques for fabrication thereof would be desirable.

SUMMARY OF THE INVENTION

The present invention provides programmable memory devices having a cross-point array of polymer junctions with individually-programmed conductances. In one aspect of the invention, a method of forming a memory device is provided. The method includes: forming first metal lines on an insulating substrate; forming polymeric resistance elements on the first metal lines, wherein the polymeric resistance elements include an organic polymer that is electrically conductive; and forming second metal lines over the polymeric resistance elements, wherein a single one of the polymeric resistance elements present at each intersection of the first metal lines and the second metal lines forming a cross-point array.

In another aspect of the invention, a memory device is provided. The memory device includes: an insulating substrate; first metal lines disposed on the insulating substrate; polymeric resistance elements disposed on the first metal lines, wherein the polymeric resistance elements include an organic polymer that is electrically conductive; and second metal lines disposed over the polymeric resistance elements, wherein a single one of the polymeric resistance elements present at each intersection of the first metal lines and the second metal lines forming a cross-point array.

In yet another aspect of the invention, a method of operating a memory device is provided. The method includes: providing the memory device having: first metal lines disposed on an insulating substrate; polymeric resistance elements disposed on the first metal lines, wherein the polymeric resistance elements include an organic polymer that is electrically conductive; second metal lines disposed over the polymeric resistance elements, wherein a single one of the polymeric resistance elements present at each intersection of the first metal lines and the second metal lines forming a cross-point array with the first metal lines forming a series of rows and the second metal lines forming a series of columns; programming the polymeric resistance elements using a voltage bias applied via the rows and the columns to increase a resistance of the polymeric resistance elements, wherein the voltage bias used program the polymeric resistance elements is greater than a threshold; and reading out a resistance value of the polymeric resistance elements.

A more complete understanding of the present invention, as well as further features and advantages of the present invention, will be obtained by reference to the following detailed description and drawings.

DETAILED DESCRIPTION OF PREFERRED EMBODIMENTS

Provided herein are programmable memory devices having a cross-point array of polymer junctions, and techniques for fabrication thereof. Each of the polymer junction serves as a polymeric resistance element having an individually-programmed conductance. Advantageously, all of the processing can be carried out at low temperatures (e.g., below about 150° C.) making the present techniques back-end-of-line (BEOL) compatible. As will be described in detail below, in one exemplary embodiment, selective chemical de-doping is used to create the individual polymeric resistance elements of the cross-point array in a single (e.g., spin-coated) polymer layer, thus forgoing the need for additional patterning and vastly simplifying the fabrication process. As is well known to those skilled in the art, resistance is a measurement of the resistance to flow of electric current, whereas conductance is the ease with which electric current passes. Thus, electrical conductance is the inverse quantity of electrical resistance, and vice versa.

According to an exemplary embodiment, the polymeric resistance elements are formed from an organic polymer such as polyaniline (PANI), polythiophene and/or polypyrrole. For instance, PANI is electrically insulating when in an Emeraldine base form,

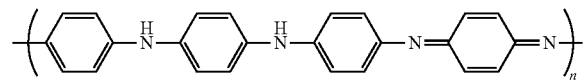

However, when exposed to an acid, protons from the acid dope the PANI making it electrically conductive in the so-called Emeraldine salt form via proton-acid doping,

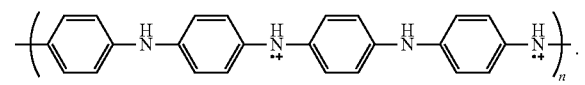

Suitable acids include, but are not limited to, trifluoromethane sulfonylimide,

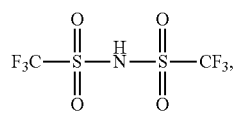 [SMILES: O=S(=O)(NS(=O)(=O)C(F)(F)F)C(F)(F)F]

tetrafluoroboric acid (HBF4), perchloric acid ($HClO_4$), hydrochloric acid (HCl), sulfuric acid ($H_2SO_4$), phosphoric acid ($H_3PO_4$), acetic acid ($CH_3COOH$), chloroacetic acid (CH2ClCOOH), dichloroacetic acid ($CHCl_2COOH$) and/or trichloroacetic acid ($CCl_3COOH$). A favorable characteristic of acid doped PANI is that it can be easily de-doped by removing the proton-acid in a basic solution. As will be described in detail below, this property will be leveraged herein, via selective chemical de-doping, to create an array of polymeric resistance elements from a single, continuous film of polymer.

After fabrication, the conductance of each polymeric resistance element can be programmed using a sequence of electrical pulses. Advantageously, the conductance is highly tunable depending, for example, on the number, voltage magnitude, duration, etc. of the applied electric pulses. As such, many 100's of distinct conductance levels are possible.

According to an exemplary embodiment, the resistance value of each polymeric resistance element can be programmed once. By way of example only, arrays of this type can be used in artificial intelligence applications such as inferencing in which known (computed) weights are programmed into an array. In inferencing applications, the weights are static and do not change. This is in contrast to learning applications, in which the weights change with time.

Figure 1:
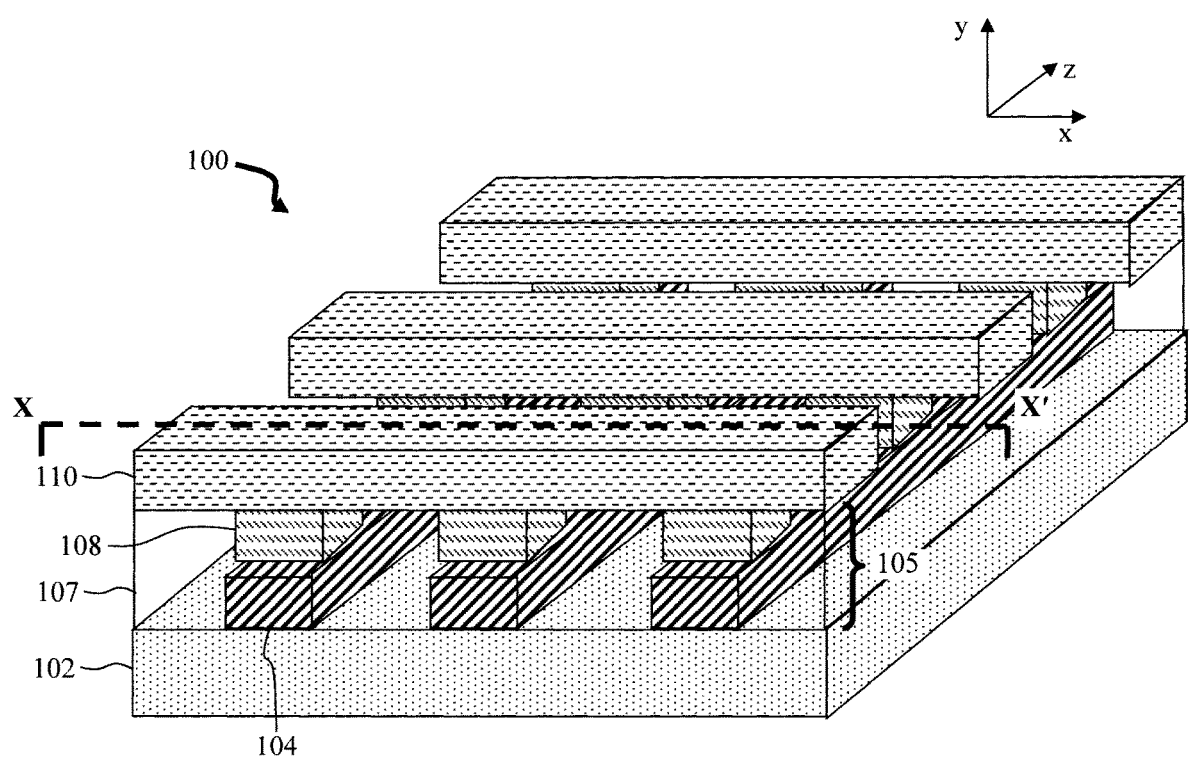
FIG. 1 is a three-dimensional diagram illustrating an exemplary memory device having a cross-point array of polymer junctions according to an embodiment of the present invention.

FIG. 1 is a diagram illustrating an exemplary memory device 100 in accordance with the present techniques having a cross-point array of polymer junctions. Specifically, as shown in FIG. 1, memory device 100 includes first metal lines 104 disposed on an (electrically) insulating substrate 102, and second metal lines 110 oriented orthogonal to first metal lines 104.

Polymeric resistance elements 108 are present between the first metal lines 104 and second metal lines 110, at the intersections of first metal lines 104 and second metal lines 110. See FIG. 1. Polymeric resistance elements 108 are formed from an electrically conductive organic polymer such as PANI doped with trifluoromethane sulfonylimide. See above. The individual polymeric resistance elements 108 can be formed using standard patterning techniques or, as will be described in detail below, can be created using selective chemical de-doping of a single layer 105 of the polymer, whereby the chemical de-doping is used to render select regions 107 of the polymer layer 105 electrically insulating. The select regions 107 of the polymer layer 105 that are chemically de-doped are those regions outside of the polymeric resistance elements 108. Thus, by way of this selective chemical de-doping process, the polymeric resistance elements 108 remain electrically conductive, whereas everywhere else the polymer layer 105 is electrically insulating. With this chemical de-doping process, cross point arrays can be fabricated from a single, continuous polymer film without the need for physical device isolation (e.g., via reactive ion etching (RIE)).

Each of the polymeric resistance elements 108 has an individually-programmed conductance. As will be described in detail below, data can be written to individual polymeric resistance elements 108 by applying electrical voltage pulses between a given one of the first metal lines 104 and one of the second metal lines 110 to change the resistance of the particular polymeric resistance element 108 that is at the intersection of the given first metal line 104 and second metal line 110. The conductance of the polymeric resistance elements 108 is highly tunable depending, for example, on the number, voltage magnitude, duration, etc. of the applied electric pulses, enabling a multitude of different conductance levels.

As highlighted above, selective chemical de-doping can be used to create the individual polymeric resistance elements of the present cross-point array memory device in a single layer of polymer. See, for example, the exemplary methodology illustrated in FIGS. 2-9. FIGS. 2-9 illustrate the fabrication process by way of reference to cross-sectional and top down views of the memory device structure. The cross-sectional views depict cuts along line X-X' (see FIG. 1) at different stages of the process. Like structures are numbered alike in the figures.

Figure 2:
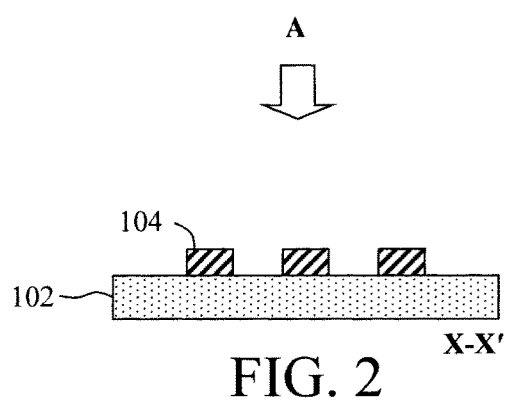
FIG. 2 is a cross-sectional diagram illustrating first metal lines having been formed on an insulating substrate according to an embodiment of the present invention.

As shown in FIG. 2, the process begins with an insulating substrate 102. Suitable insulating substrates include, but are not limited to, oxide substrates such as silicon oxide (SiOx) substrates, silicon oxycarbide (SiOC) substrates, etc. It is notable that, although not shown, one or more device elements may already be present. For instance, by way of example only, insulating substrate 102 may be one component layer of a larger semiconductor wafer having device elements such as transistors, resistors, capacitors, etc. already formed thereon.

First metal lines 104 are next formed on insulating substrate 102. Suitable metals for first metal lines 104 include, but are not limited to, copper (Cu), gold (Au), nickel (Ni), platinum (Pt), palladium (Pd) and/or cobalt (Co). The metal can be deposited using a process such as sputtering, evaporation or electrochemical plating, and then patterned into the individual first metal lines 104 using standard lithography and etching techniques. Alternatively, a lift-off process or deposition through a mask can also be employed.

Figure 3:
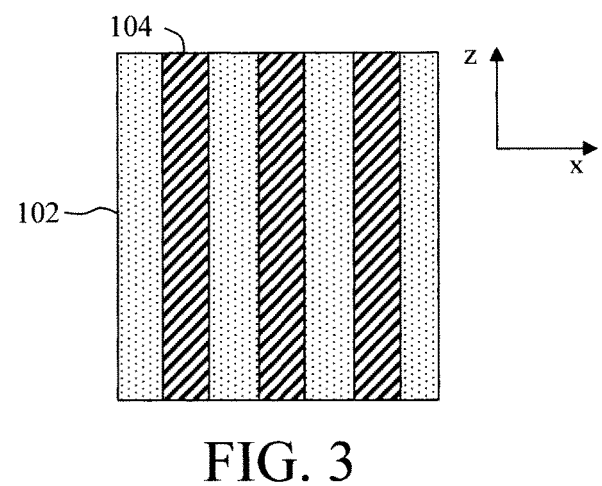
FIG. 3 is a top-down diagram illustrating the first metal lines having been formed on the insulating substrate according to an embodiment of the present invention.

FIG. 3 is a top-down diagram (i.e., from view point A—see FIG. 2) of the first metal lines 104 having been formed on insulating substrate 102. As shown in FIG. 3, first metal lines 104 extend along the z-direction. As will be described in detail below, the second metal lines 110 will be formed along the x-direction above, and orthogonal to, the first metal lines 104.

Figure 4:
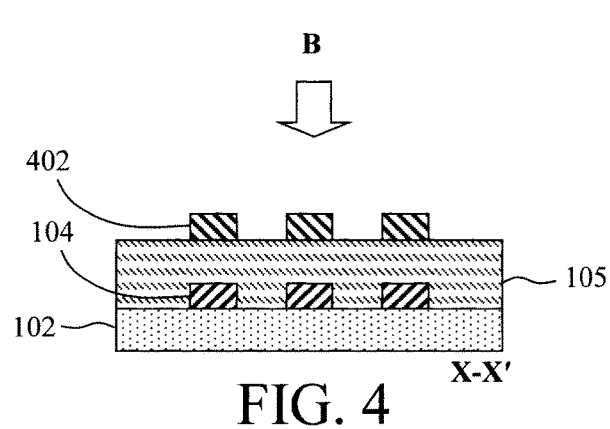
FIG. 4 is a cross-sectional diagram illustrating a layer of an electrically conductive organic polymer having been deposited onto the insulating substrate over the first metal lines, and an electrically conductive mask having been formed on the organic polymer covering/masking those regions of the organic polymer corresponding to polymeric resistance elements which will remain electrically conductive according to an embodiment of the present invention.

Next, as shown in FIG. 4, a layer of an electrically conductive organic polymer 105 is then deposited onto the insulating substrate 102 over the first metal lines 104. As provided above, suitable electrically conductive organic polymers include, but are not limited to, PANI doped with trifluoromethane sulfonylimide.

According to an exemplary embodiment, the Emeraldine base form of PANI (which is electrically insulating—see above) is mixed with an acid (e.g., trifluoromethane sulfonylimide) in a solvent (such as water or alcohol) to form a solution of the electrically conductive Emeraldine salt form of PANI. The solution is then deposited onto the insulating substrate 102/first metal lines 104 using a casting process such as spin-coating to form the layer of electrically conductive organic polymer 105 over the first metal lines 104. An anneal (e.g., at a temperature of from about 50° C. to about 200° C. and ranges therebetween) can be performed to remove the solvent.

At this stage, the entire layer consists of the electrically conductive form of the organic polymer 105. However, as will be described in detail below, a chemical de-doping process will be used to selectively de-dope regions 107 of the organic polymer 105 outside of the polymeric resistance elements 108. Chemical de-doping renders these regions 107 of the organic polymer 105 electrically insulating. This chemical de-doping process provides a simple and effective way to create individual polymeric resistance elements 108 in a cross-point array without the need for additional patterning steps, and results in a unique device structure having a single layer of the organic polymer 105 with both electrically insulating regions 107 and electrically conductive regions, i.e., polymeric resistance elements 108, present in the same layer.

Prior to performing the chemical de-doping, the regions of organic polymer 105 that are to remain electrically conductive, i.e., those regions corresponding to the polymeric resistance elements 108, need to be masked. To do so, according to an exemplary embodiment an electrically conductive mask 402 is next formed on the organic polymer 105 covering/masking those regions of the organic polymer 105 corresponding to the polymeric resistance elements 108 which will remain electrically conductive. Since the mask 402 is electrically conductive, it can remain in place following the chemical de-doping, and then simply be covered over by the second metal lines 110.

According to an exemplary embodiment, electrically conductive mask 402 is formed from the same or different metal(s) as first metal lines 104. As provided above, suitable metals include, but are not limited to, Cu, Au, Ni, Pt, Pd and/or Co. The metal can be deposited using a process such as sputtering, evaporation or electrochemical plating, and then patterned into the electrically conductive mask 402 using standard lithography and etching techniques. Alternatively, a lift-off process or deposition through a mask can also be employed.

Figure 5:
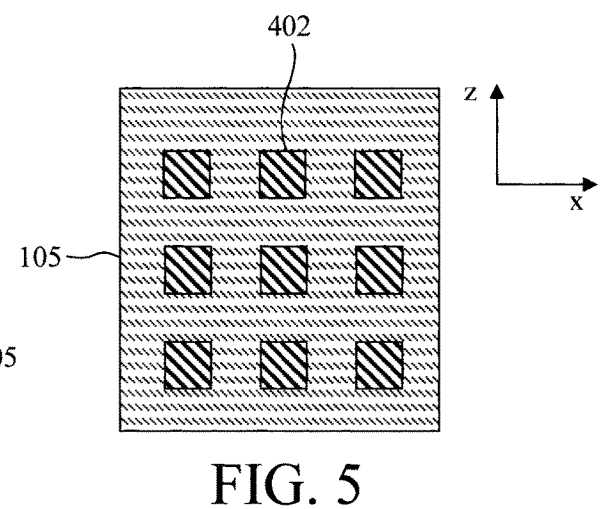
FIG. 5 is a top-down diagram illustrating the electrically conductive mask having been formed on the organic polymer according to an embodiment of the present invention.

FIG. 5 is a top-down diagram (i.e., from view point B—see FIG. 4) of the electrically conductive mask 402 having been formed on the organic polymer 105. As shown in FIG. 5, the electrically conductive mask 402 covers/masks only select (first) regions of the organic polymer 105, i.e., those regions of the organic polymer 105 corresponding to the polymeric resistance elements 108 which will remain electrically conductive following the chemical de-doping, while leaving other (second) regions of the organic polymer 105, i.e., those regions of the organic polymer 105 that will be chemically de-doped, exposed.

Chemical de-doping is then used to selectively de-dope all but those (first) regions of the organic polymer 105 covered by mask 402 which correspond to the polymeric resistance elements 108. The (second) select regions 107 of the polymer layer 105 that are chemically de-doped at this stage are rendered electrically insulating by this process. Namely, as provided above, undoped the polymer layer 105 is electrically insulating. However, protons from an acid are used to dope the organic polymer 105 making it electrically conductive. Use of a basic de-doping agent (see below) removes the proton-acid dopant. Thus, select regions of the organic polymer 105 contacted with the de-doping agent revert back to their undoped/electrically insulating state, whereas the remainder of organic polymer 105 remains doped/electrically conductive.

According to an exemplary embodiment, organic polymer 105 is PANI doped with trifluoromethane sulfonylimide and, via this chemical de-doping process, regions 107 of organic polymer 105 revert to the (undoped) Emeraldine base form which is electrically insulating. As a result, two distinct regions now exist in the same layer of organic polymer 105, i.e., electrically conductive regions corresponding to polymeric resistance elements 108 and electrically insulating regions 107.

The chemical de-doping is carried out by contacting the polymer layer 105 with a de-doping agent such as sodium carbonate ($Na_2CO_3$), ammonia ($NH_3$) and/or alkali metal hydroxides such as lithium hydroxide (LiOH), sodium hydroxide (NaOH), potassium hydroxide (KOH), rubidium hydroxide (RbOH) and/or caesium hydroxide (CsOH). For instance, according to an exemplary embodiment, polymer layer 105 is contacted with an aqueous solution of $Na_2CO_3$ by dipping the memory device structure into the $Na_2CO_3$ solution. Alternatively, the $Na_2CO_3$ solution can be sprayed or otherwise cast onto the device structure. By way of this process, those regions (i.e., regions 107) of polymer layer 105 exposed to the de-doping agent will be de-doped, and thereby rendered electrically insulating. Conversely, those regions (i.e., polymeric resistance elements 108) of polymer layer 105 masked from exposure to the de-doping agent by electrically conductive mask 402 will remain electrically conductive. As such, two distinct regions will be created in the same layer of organic polymer 105, one that is electrically insulating and another that is electrically conductive.

Figure 6:
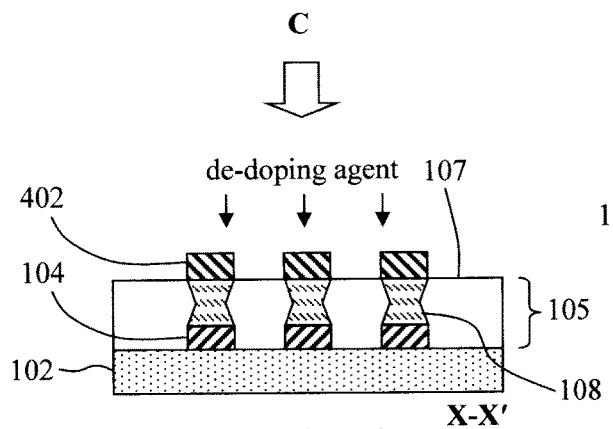
FIG. 6 is a cross-sectional diagram illustrating the polymer layer having been contacted with a de-doping agent which results in the formation of electrically insulating regions in organic polymer via chemical de-doping, whereby the presence of the mask blocks chemical de-doping in certain other regions of the organic polymer creating the polymeric resistance elements on the first metal lines according to an embodiment of the present invention.

Specifically, as shown in FIG. 6, contacting polymer layer 105 with the de-doping agent results in the formation of electrically insulating regions 107 in organic polymer 105 via chemical de-doping. However, the presence of mask 402 blocks chemical de-doping in certain other regions of organic polymer 105 creating polymeric resistance elements 108 on the first metal lines 104. Namely, as described in detail above, these regions of organic polymer 105 that form the polymeric resistance elements 108 remain electrically conductive.

As shown in FIG. 6, the chemical de-doping is blocked at the top (and to some extent at the bottom) of these regions of organic polymer 105 by mask 402 and first metal lines 104, respectively. Thus, the regions of organic polymer 105 in between mask 402 and first metal lines 104 remain chemically doped, and thus electrically conductive. When organic polymer 105 is contacted with the de-doping agent (e.g., dipped, sprayed, etc.), the de-doping agent will have access to the exposed areas of organic polymer 105 not blocked by mask 402. As the de-doping agent permeates the layer it moves laterally and vertically through organic polymer 105, giving the polymeric resistance elements 108 more of an hourglass cross-sectional shape between the mask 402 and first metal lines 104 (see FIG. 6) as opposed to a straight column. However, what is important is that each of the polymeric resistance elements 108 creates an electrically conductive pathway of organic polymer 105 between the (electrically conductive) mask 402 and the first metal lines 104, and that the polymeric resistance elements 108 are separated from one another by the electrically insulating regions 107 of organic polymer 105. Further, as shown in FIG. 6, two distinct regions are now present in the same layer of organic polymer 105, one that is electrically insulating (regions 107) and another that is electrically conductive (polymeric resistance elements 108).

Figure 7:
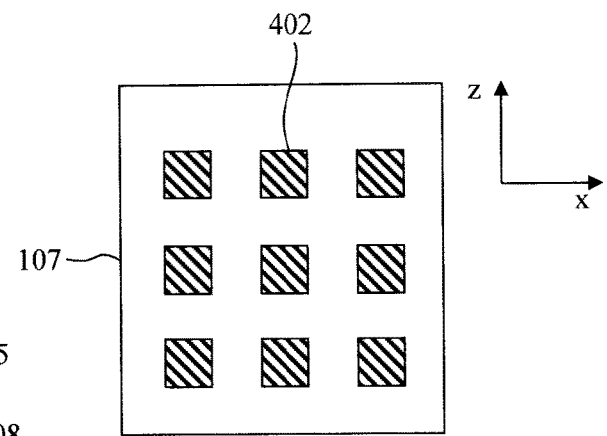
FIG. 7 is a top-down diagram illustrating the formation of electrically insulating regions outside the mask after de-doping of the organic polymer according to an embodiment of the present invention.

FIG. 7 is a top-down diagram (i.e., from view point C—see FIG. 6) after de-doping of organic polymer 105. As shown in FIG. 7, outside of the regions covered by mask 402, organic polymer 105 is now electrically insulating (see regions 107 surrounding mask 402). The (electrically-conductive) polymeric resistance elements 108 (not visible in this top-down depiction) are present beneath the mask 402.

Figure 8:
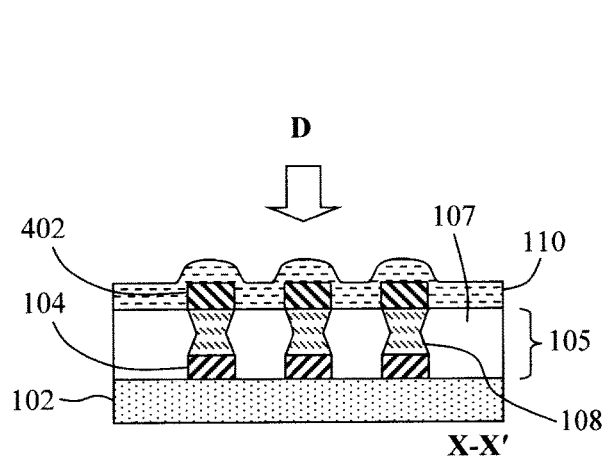
FIG. 8 is a cross-sectional diagram illustrating second metal lines having been formed on the layer of organic polymer over the polymeric resistance elements and mask according to an embodiment of the present invention.

Next, second metal lines 110 are formed on the layer of organic polymer 105 over the polymeric resistance elements 108. See FIG. 8. As shown in FIG. 8, the first metal lines 104 and the second metal lines 110 run below and above the polymeric resistance elements 108, respectively. Further, as highlighted above, the first metal lines 104 and the second metal lines 110 are oriented orthogonal to one another such that a single polymeric resistance element 108 is present at each intersection of the first and second metal lines 104 and 110.

In this particular example, since the mask 402 is electrically conductive, the second metal lines 110 can simply be formed over the mask 402. Namely, access to the polymeric resistance elements 108 by the second metal lines 110 occurs through the mask 402. As shown in FIG. 8, this process results in a unique metal structure over the polymeric resistance elements 108, i.e., second metal lines 110 having a raised topography wherever they pass over the mask 402.

Suitable metals for second metal lines 110 include, but are not limited to, Cu, Au, Ni, Pt, Pd and/or Co. The metal can be deposited using a process such as sputtering, evaporation or electrochemical plating, and then patterned into the individual second metal lines 110 using standard lithography and etching techniques. Alternatively, a lift-off process or deposition through a mask can also be employed.

Figure 9:
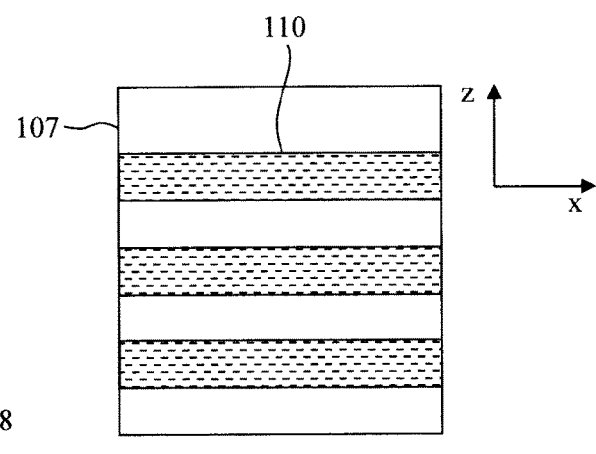
FIG. 9 is a top-down diagram illustrating the second metal lines having been formed on the layer of organic polymer over the polymeric resistance elements and the mask according to an embodiment of the present invention.

FIG. 9 is a top-down diagram (i.e., from view point D—see FIG. 8) of the second metal lines 110 having been formed on organic polymer 105. As shown in FIG. 9, second metal lines 110 extend along the x-direction. As described above, the first metal lines 104 were formed along the z-direction above, and thus are orthogonal to the second metal lines 110. Further, as shown in FIG. 9, only the electrically insulating regions 107 of organic polymer 105 are visible in this top-down depiction. Second metal lines 110 cover over the polymeric resistance elements 108.

It is notable that, while the exemplary methodology illustrated in FIGS. 2-9 based on provides a convenient and effective way to fabricate the present memory device array using chemical de-doping, the present techniques are not limited to any particular fabrication process. For instance, alternatively, the polymeric resistance elements 108 can be defined from the organic polymer 105 by lithography and etching to pattern the layer of organic polymer 105 into individual, e.g., pillars, of electrically conductive polymeric resistance elements 108.

Figure 10:
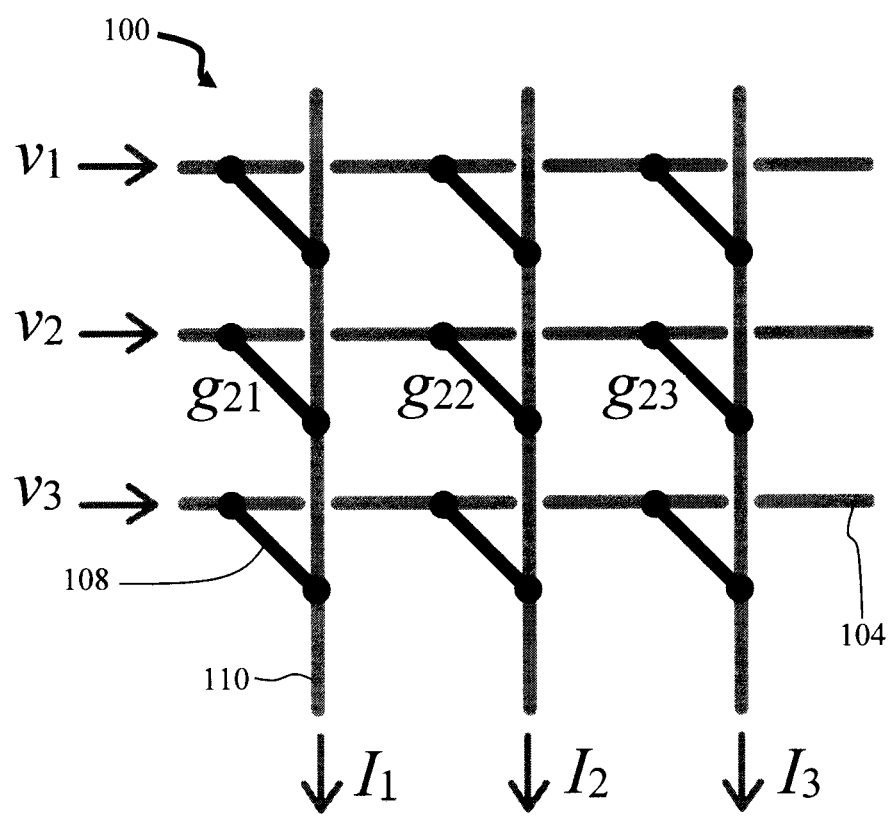
FIG. 10 is a schematic diagram of the present memory device having a cross-point array of polymer junctions according to an embodiment of the present invention.

Operation of the present memory device is now described by way of reference to FIGS. 10-15. Referring to FIG. 10, a schematic depiction of memory device 100. As described above, memory device 100 includes first metal lines 104, and second metal lines 110 orthogonal to the first metal lines 104. Polymeric resistance elements 108 are present between the first and second metal lines 104 and 110 forming a cross-point array. In this depiction, the first metal lines 104 and the second metal lines 110 form a series of rows i and columns j running below and above the polymeric resistance elements 108, respectively. Each polymeric resistance element 108 is labeled by its corresponding conductance, $g_{rc}$, wherein r and c specify the row and column of the array, respectively, at which the given polymeric resistance element 108 is located. For instance, each polymeric resistance element 108 along row 2 of the array has the designation $g_{\{2,c\}}$, with the polymeric resistance element 108 along row 2 at column 1 designated as $g_{21}$, the polymeric resistance element 108 along row 2 at column 2 designated as $g_{22}$, and so on.

Figure 11:
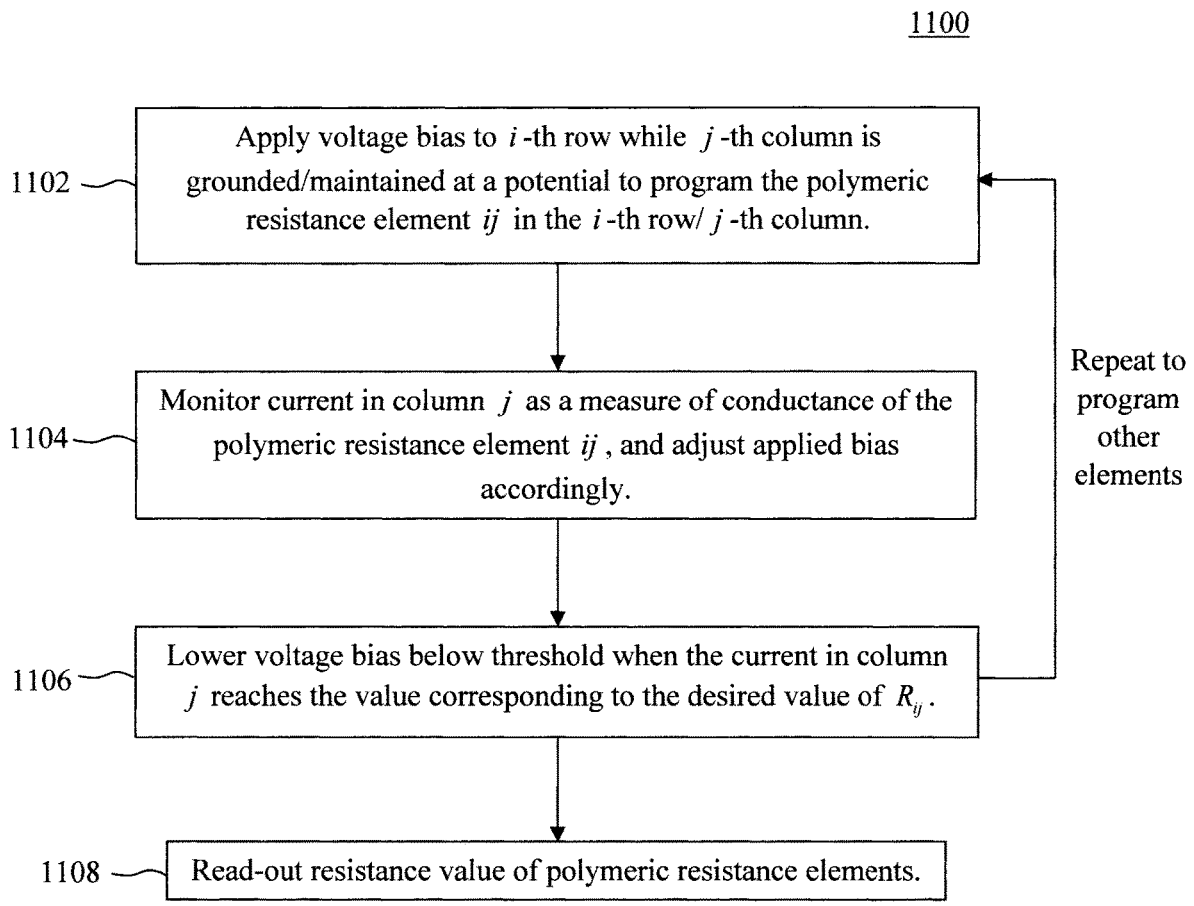
FIG. 11 is a diagram illustrating an exemplary methodology for operating the memory device of FIG. 10 according to an embodiment of the present invention.

An exemplary methodology 1100 for operating memory device 100 is provided in FIG. 11. As highlighted above, programming of memory device 100 is accomplished by applying a voltage via the first/second metal lines 104/110 to change (i.e., increase) the resistance $R_{ij}$ of the polymeric resistance elements 108. This resistance change occurs with an applied voltage above a threshold, which depends on the geometry and doping levels of the polymer. This threshold can be measured for a given device layout and polymer formulation. For instance, by way of example only, the conductance of the polymeric resistance elements can be measured as the applied voltage is slowly increased. Up to a certain point, the conductance will actually increase with the applied bias. However, if the applied bias is large enough, the conductance will start to go down. This is the threshold. Once the threshold has been passed, the conductance is permanently lowered. Advantageously, the existence of this voltage threshold for device programming enables programming of individual polymeric resistance elements 108 in the array without the need for selector devices at each junction. In general, the programming scheme must ensure that only the polymeric resistance element or elements 108 that is/are to be programmed have an applied bias that is larger than the threshold. Specifically, the bias applied to a polymeric resistance element ij, that is, between row i and column j is given by $|V_i-V_j|$ where $V_i$ is the voltage applied to row i and $V_j$ is the voltage applied to column j. The voltage bias of all other polymeric resistance elements must be lower than the threshold.

To program the polymeric resistance element ij in the i-th row and j-th column of memory device 100, a programming voltage bias is applied to row i, while column j is grounded (or maintained at a potential such that the applied voltage to polymeric resistance element ij is greater than the threshold). See step 1102. The voltage bias applied in step 1102 can be continuous or in the form of discrete voltage pulses.

In step 1104, the current in column j is monitored continuously as a measure of the conductance of polymeric resistance element ij. With an applied bias above the threshold, the current in column j will decrease with time as the resistance of polymeric resistance element ij (i.e., $R_{ij}$) increases. If need be, the applied bias can be adjusted accordingly. For instance, according to an exemplary embodiment, the programming voltage applied in step 1102 is from about 1 volt (V) to about 15 V and ranges therebetween, e.g., from about 5 V to about 7 V and ranges therebetween. However, the exact programming parameters depend on the geometry and doping levels of the polymer. Thus, if no current decrease in column j is detected in step 1104, then an increase in the applied bias might be needed to reach the threshold.

When the current in column j reaches the value corresponding to the desired value of $R_{ij}$ (meaning that the polymeric resistance elements 108 have been programmed), the voltage bias applied to polymeric resistance element ij is lowered below the threshold (e.g., by raising a voltage applied to column j). See step 1106.

As shown in FIG. 11, steps 1102-1106 are then repeated to program another polymeric resistance element, and so on, until all of the polymeric resistance elements 108 of memory device 100 are programmed. The resistance value of each polymeric resistance element 108 can be programmed once. Namely, as provided above, application of a programming voltage increases the resistance value of the polymeric resistance elements 108. This resistance value cannot be reset back to its pre-programmed value. However, depending on the programming voltage magnitude, duration, number of pulses, etc. a multitude of resistance value combinations can be obtained in the array.

Once programmed, the resistance values of each polymeric resistance element 108 in the array can be read simply by applying a lower value read voltage to a given row (via the corresponding first metal line 104) and measuring the output current at the intersecting column (via the corresponding second metal lines 110). See step 1108. The read voltage has to be lower than the voltage threshold in order to prevent altering (i.e., increasing) the resistance value of the polymeric resistance elements 108. For instance, according to an exemplary embodiment, the read voltage employed in step 1108 is from about 0.5 V to about 0.8 V and ranges therebetween.

A similar process can be implemented for programming all of the polymeric resistance elements 108 in a given row (e.g., row i). See, for example, exemplary methodology 1200 of FIG. 12.

To program all of the polymeric resistance elements in row i of memory device 100, a programming voltage bias is applied to row i, while all of the columns are grounded (or maintained at a potential such that the applied voltage to the polymeric resistance elements in row i is greater than the threshold). See step 1202. The voltage bias applied in step 1202 can be continuous or in the form of discrete voltage pulses.

In step 1204, the current in each column is monitored continuously as a measure of the conductance of the corresponding polymeric resistance element in row i. As above, with an applied bias above the threshold, the current in each columns will decrease with time as the resistance of the corresponding polymeric resistance element in row i (i.e., $R_{ij}$) increases. If need be, the applied bias can be adjusted accordingly. For instance, according to an exemplary embodiment, the programming voltage applied in step 1202 is from about 1 V to about 15 V and ranges therebetween, e.g., from about 5 V to about 7 V and ranges therebetween. However, the exact programming parameters depend on the geometry and doping levels of the polymer. Thus, if no current decrease in the columns is detected in step 1204, then an increase in the applied bias might be needed to reach the threshold.

When the current in each column reaches the value corresponding to the desired value of $R_{ij}$ (meaning that the corresponding polymeric resistance elements in row i has been programmed), the voltage bias applied to that corresponding polymeric resistance element is lowered below the threshold (e.g., by raising a voltage applied to the corresponding column). See step 1206. This process is carried out in parallel for all of the polymeric resistance elements in row i.

Figure 12:
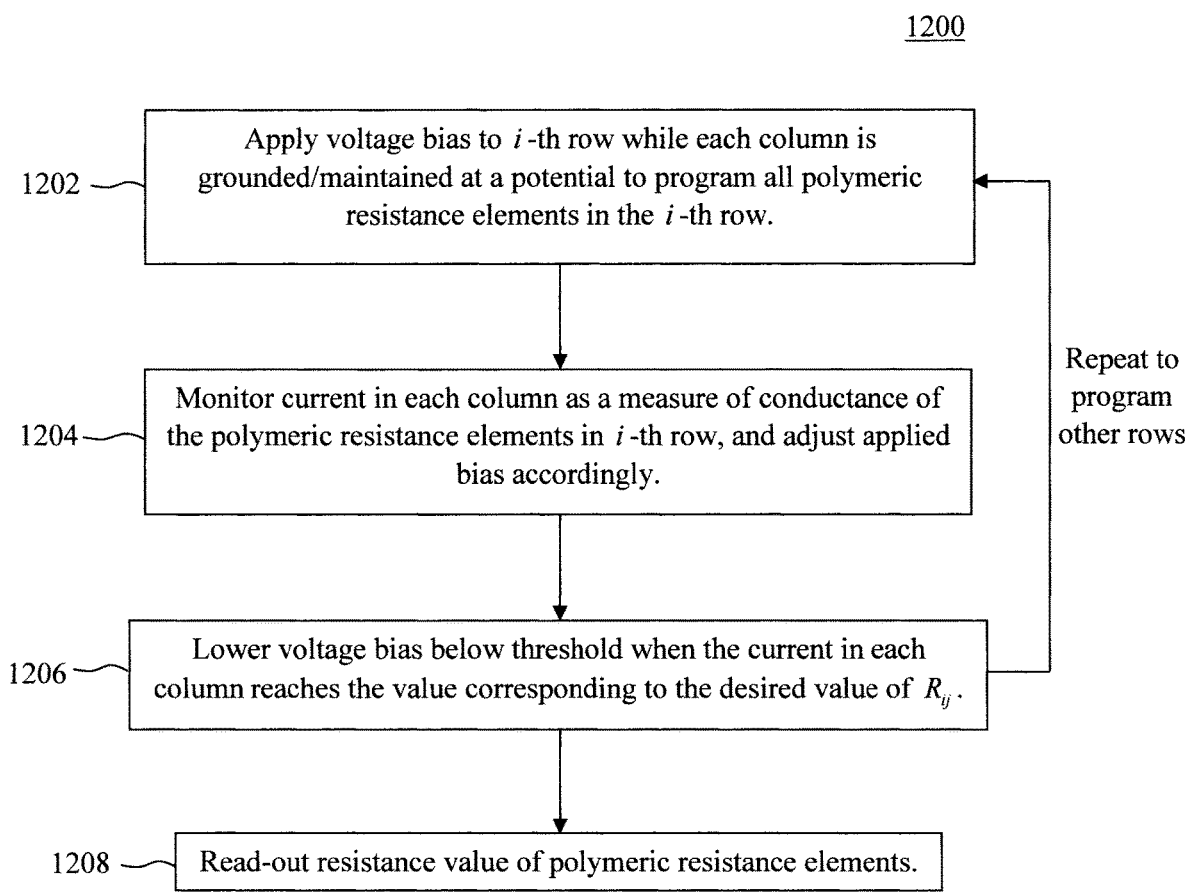
FIG. 12 is a diagram illustrating another exemplary methodology for operating the memory device of FIG. 10 according to an embodiment of the present invention.
Figure 13:
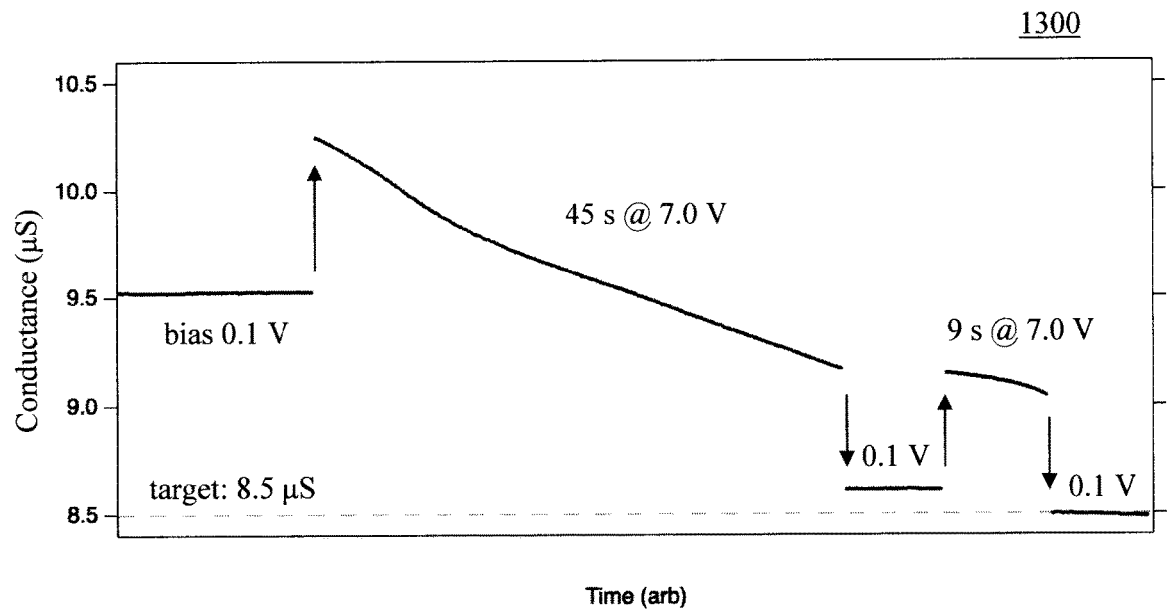
FIG. 13 is a diagram illustrating how the duration for which the programming voltage is used to vary the conductance of the polymeric resistance elements according to an embodiment of the present invention.
Figure 14:
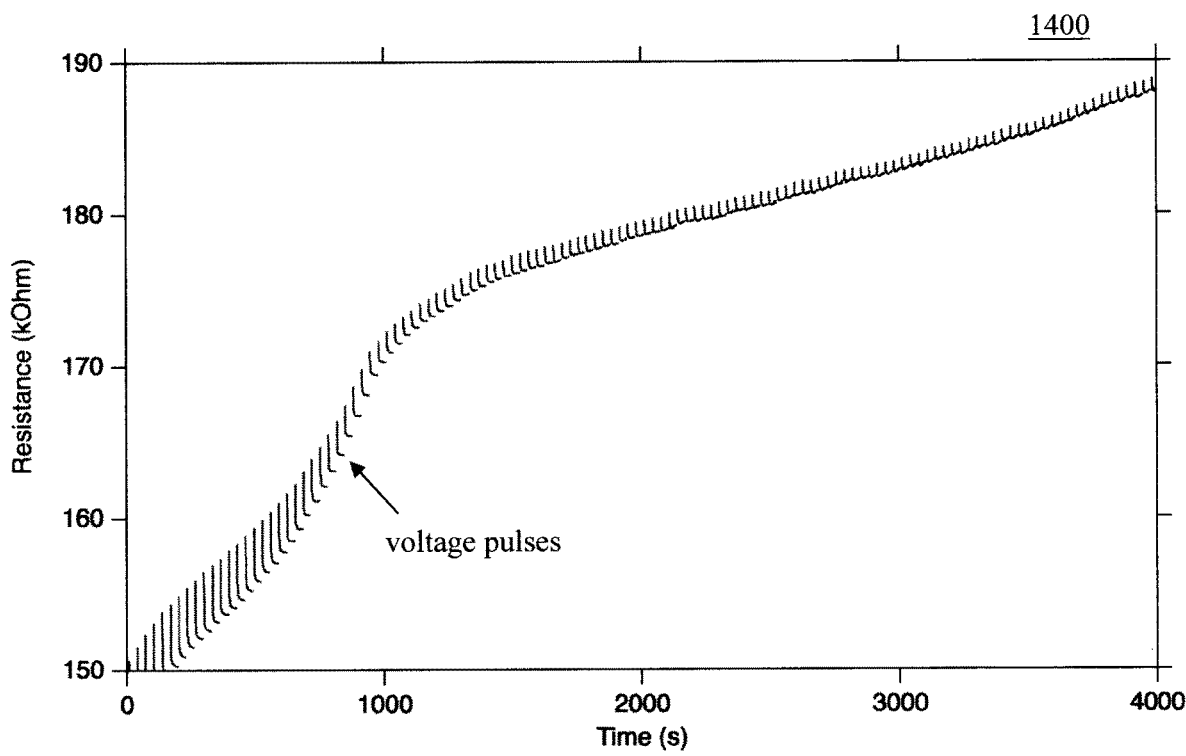
FIG. 14 is a diagram illustrating how a sequence of individual programming voltage pulses is used to incrementally increase the resistance of the polymeric resistance elements according to an embodiment of the present invention.

As shown in FIG. 12, steps 1202-1206 are then repeated to program the polymeric resistance elements in another row of memory device 100, and so on, until all of the polymeric resistance elements 108 of memory device 100 are programmed. The resistance value of each polymeric resistance element 108 can be programmed once. Namely, as provided above, application of a programming voltage increases the resistance value of the polymeric resistance elements 108. This resistance value cannot be reset back to its pre-programmed value. However, depending on the programming voltage magnitude, duration, number of pulses, etc. a multitude of resistance value combinations can be obtained in the array.

Once programmed, the resistance values of each polymeric resistance element 108 in the array can be read simply by applying a lower value read voltage to a given row (via the corresponding first metal line 104) and measuring the output current at the intersecting column (via the corresponding second metal lines 110). See step 1208. The read voltage has to be lower than the voltage threshold in order to prevent altering (i.e., increasing) the resistance value of the polymeric resistance elements 108. For instance, according to an exemplary embodiment, the read voltage employed in step 1208 is from about 0.5 V to about 0.8 V and ranges therebetween.

As provided above, the voltage bias applied to program polymeric resistance elements 108 can be continuous or in the form of discrete voltage pulses. The duration for which the programming voltage is continuously applied can be used to vary the conductance of the polymeric resistance elements 108. Referring, for example, to plot 1300 of FIG. 13 it can be seen that applying a programming voltage of 7.0V for a longer duration (e.g., 45 seconds (s) versus 9 s) has a greater impact on reducing the conductance (micro siemens (µS)) of the polymeric resistance elements 108. Thus, to reach a desired target conductance, one can simply apply a programming voltage of a given magnitude continuously while monitoring the current $I_X$ until (i.e., for the duration needed) the conductance reaches the desired value.

Alternatively, the number of programming voltage pulses can be used to vary the conductance of the polymeric resistance elements 108. Referring, for example, to plot 1400 of FIG. 14 it can be seen that a sequence of individual programming voltage pulses can be used to incrementally increase the resistance (kilohms (kOhms)) of the polymeric resistance elements 108. In this particular example, the programming voltage pulses were of a fixed magnitude/duration, i.e., 15V/2 s. Thus, to reach a desired target conductance (the inverse of the resistance), one can simply apply programming voltage pulses of a fixed magnitude/duration, and measure the current $I_X$ until the conductance reaches the desired value.

Figure 15:
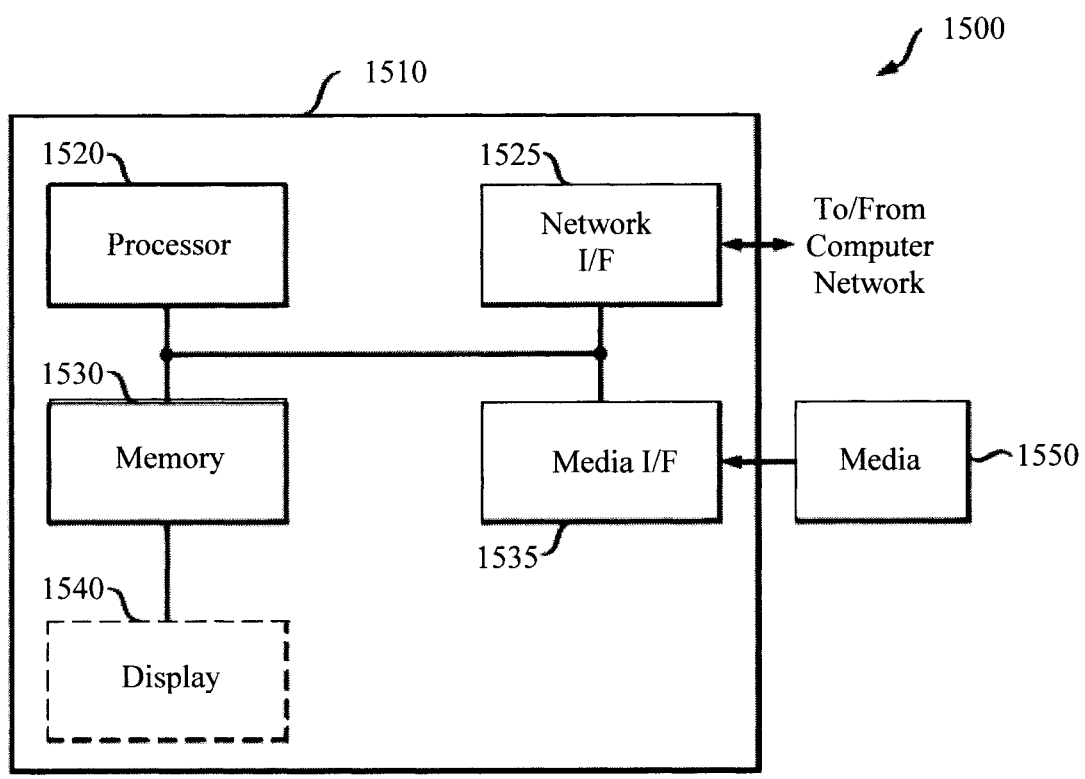
FIG. 15 is a diagram illustrating an exemplary apparatus according to an embodiment of the present invention.

The present memory devices can be included in and/or operated in conjunction with an apparatus such as apparatus 1500 of FIG. 15. As shown in FIG. 15, apparatus 1500 includes a computer system 1510 and removable media 1550. Computer system 1510 includes a processor device 1520, a network interface 1525, a memory 1530, a media interface 1535 and an optional display 1540. Network interface 1525 allows computer system 1510 to connect to a network, while media interface 1535 allows computer system 1510 to interact with media, such as a hard drive or removable media 1550.

Processor device 1520 can be configured to implement the methods, steps, and functions disclosed herein. The memory 1530 could be distributed or local and the processor device 1520 could be distributed or singular. The memory 1530 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1520. With this definition, information on a network, accessible through network interface 1525, is still within memory 1530 because the processor device 1520 can retrieve the information from the network. It should be noted that each distributed processor that makes up processor device 1520 generally contains its own addressable memory space. It should also be noted that some or all of computer system 1510 can be incorporated into an application-specific or general-use integrated circuit.

Optional display 1540 is any type of display suitable for interacting with a human user of apparatus 1500. Generally, display 1540 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a memory device, the method comprising the steps of:
   forming first metal lines on an insulating substrate;
   forming polymeric resistance elements on the first metal lines and an electrically conductive mask in direct contact with the polymeric resistance elements, wherein the polymeric resistance elements comprise select regions of an organic polymer that are is electrically conductive, and wherein the electrically conductive mask is disposed on top of the organic polymer selectively over the polymeric resistance elements; and
   forming second metal lines on the organic polymer that are conformal over, and in direct contact with, the electrically conductive mask such that the second metal lines have a raised topography wherever the second metal lines pass over the electrically conductive mask, wherein a single one of the polymeric resistance elements is present at each intersection of the first metal lines and the second metal lines forming a cross-point array.

2. The method of claim 1, wherein the organic polymer comprises polyaniline.

3. The method of claim 1, wherein the organic polymer is doped with an acid.

4. The method of claim 3, wherein the acid comprises trifluoromethane sulfonylimide.

5. The method of claim 1, further comprising the steps of:
   depositing the organic polymer onto the insulating substrate over the first metal lines;
   forming the electrically conductive mask on the organic polymer that covers first regions of the organic polymer corresponding to the polymeric resistance elements, while exposing second regions of the organic polymer; and
   de-doping the second regions of the organic polymer to make the second regions of the organic polymer electrically insulating such that, following the de-doping, two distinct regions exist in a same layer of the organic polymer: the first regions of the organic polymer which comprise the select regions of the organic polymer that are electrically conductive and correspond to the polymeric resistance elements, and the second regions of the organic polymer which are electrically insulating.

6. The method of claim 5, wherein the electrically conductive mask comprises a metal selected from the group consisting of: copper (Cu), gold (Au), nickel (Ni), platinum (Pt), palladium (Pd), cobalt (Co) and combinations thereof.

7. The method of claim 5, further comprising the step of:
   forming the second metal lines over the electrically conductive mask and in direct contact with the second regions of the organic polymer which are electrically insulating.

8. The method of claim 5, wherein the de-doping step comprises the step of:
   contacting the organic polymer with a de-doping agent.

9. The method of claim 8, wherein the de-doping agent comprises sodium carbonate ($Na_2CO_3$).

10. A memory device, comprising:
    an insulating substrate;
    first metal lines disposed on the insulating substrate;
    polymeric resistance elements disposed on the first metal lines, wherein the polymeric resistance elements comprise select regions of an organic polymer that are is electrically conductive;
    an electrically conductive mask disposed on top of the organic polymer selectively over, and in direct contact with, the polymeric resistance elements; and
    second metal lines disposed on the organic polymer that are conformal over, and in direct contact with the electrically conductive mask such that the second metal lines have a raised topography wherever the second metal lines pass over the electrically conductive mask, wherein a single one of the polymeric resistance elements is present at each intersection of the first metal lines and the second metal lines forming a cross-point array.

11. The memory device of claim 10, wherein the organic polymer comprises polyaniline doped with an acid.

12. The memory device of claim 11, wherein the acid comprises trifluoromethane sulfonylimide.

13. The memory device of claim 11, further comprising:
a layer of the organic polymer disposed on the insulating substrate over the first metal lines, wherein the layer of the organic polymer comprises: first regions which comprise the select regions of the organic polymer that are electrically conductive and correspond to the polymeric resistance elements, and second regions which are electrically insulating.

14. The memory device of claim 13, further comprising:
the electrically conductive mask on the layer of the organic polymer that covers the first regions.

15. The memory device of claim 14, wherein the electrically conductive mask comprises a metal selected from the group consisting of: Cu, Au, Ni, Pt, Pd, Co and combinations thereof.

16. The memory device of claim 14, wherein the second metal lines are disposed over the electrically conductive mask and in direct contact with the second regions which are electrically insulating.

* * * * *